United States Patent
Zhang et al.

(10) Patent No.: US 11,009,543 B2
(45) Date of Patent: May 18, 2021

(54) SOCKET TESTING METHOD AND SYSTEM

(71) Applicants: INVENTEC (PUDONG) TECHNOLOGY CORPORATION, Shanghai (CN); INVENTEC CORPORATION, Taipei (TW)

(72) Inventors: Yan qing Zhang, Shanghai (CN); Hong bin Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 132 days.

(21) Appl. No.: 16/567,651

(22) Filed: Sep. 11, 2019

(65) Prior Publication Data

US 2021/0063476 A1    Mar. 4, 2021

(30) Foreign Application Priority Data

Sep. 3, 2019  (CN) .......................... 201910827548.6

(51) Int. Cl.
*G01R 31/28* (2006.01)
*G01R 1/04* (2006.01)

(52) U.S. Cl.
CPC ....... *G01R 31/2886* (2013.01); *G01R 1/0441* (2013.01); *G01R 31/2863* (2013.01)

(58) Field of Classification Search
CPC .................................. G01R 31/28; G01R 1/04
See application file for complete search history.

(56) References Cited

U.S. PATENT DOCUMENTS

2018/0294244 A1* 10/2018 Onozawa ........... G01R 31/2813

FOREIGN PATENT DOCUMENTS

TW          201501079      *  1/2015  ............... G06T 7/00

* cited by examiner

*Primary Examiner* — Neel D Shah
(74) *Attorney, Agent, or Firm* — Maschoff Brennan (57) ABSTRACT

A socket testing method comprises obtaining a raw socket image, performing binarization on the raw socket image to generate a binarized socket image, determining a plurality of pinhead locations in the binarized socket image, applying a grid with the grid including a plurality of intersections to the binarized socket image, for each of the plurality of pinhead locations, obtaining the distance between the pinhead location and one of the plurality of intersections which is nearest to the pinhead location, and outputting a warning signal associated with the pinhead location when determining that the distance is larger than a tolerance value.

9 Claims, 6 Drawing Sheets

SOCKET TESTING METHOD AND SYSTEM

CROSS-REFERENCE TO RELATED APPLICATIONS

This non-provisional application claims priority under 35 U.S.C. § 119(a) on Patent Application No(s). 201910827548.6 filed in China on Sep. 3, 2019, the entire contents of which are hereby incorporated by reference.

BACKGROUND

1. Technical Field

This disclosure relates to a testing method of a socket, and particularly to a testing method of a central processing unit socket.

2. Related Art

A motherboard is the center or main circuit board that constitutes a complex electronic system, and can be coupled to a device such as a processor, a display card, a hard disk drive, a memory, an external device, etc. In the case of central processing unit (CPU), it was directly soldered to the motherboard in the early stage; hereafter, due to the variety of the CPU and the popularity of self-assembly, CPU sockets are developed to facilitate the disassembly and replacement.

With the diversification of CPU operation functions, the number of pins in a CPU socket is increasing and the density of the pins is getting higher and higher. Therefore, the detection requirement for the CPU socket is also increasing, and the existing detection equipment no longer meets the requirement.

SUMMARY

According to one or more embodiment of this disclosure, a socket testing method comprises obtaining a raw socket image, performing binarization on the raw socket image to generate a binarized socket image, determining a plurality of pinhead locations in the binarized socket image, applying a grid with the grid including a plurality of intersections to the binarized socket image, for each of the plurality of pinhead locations, obtaining the distance between the pinhead location and one of the plurality of intersections which is nearest to the pinhead location, and outputting a warning signal associated with the pinhead location when determining that the distance is larger than a tolerance value.

According to one or more embodiment of this disclosure, a socket testing system comprises a light assembly, an image sensor and a processor, wherein the processor is connected with the light assembly and the image sensor. The light assembly is configured to illuminate a socket. The image sensor is configured to obtain a raw socket image of the socket. The processor is configured to perform binarization on the raw socket image for generating a binarized socket image, to determine a plurality of pinhead locations in the binarized socket image, to apply a grid including a plurality of intersections to the binarized socket image, to obtain a distance between each of the plurality of pinhead locations and one of the plurality of intersections which is nearest to the pinhead location, and to output a warning signal associated with the pinhead location when determining the distance is larger than a tolerance value.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
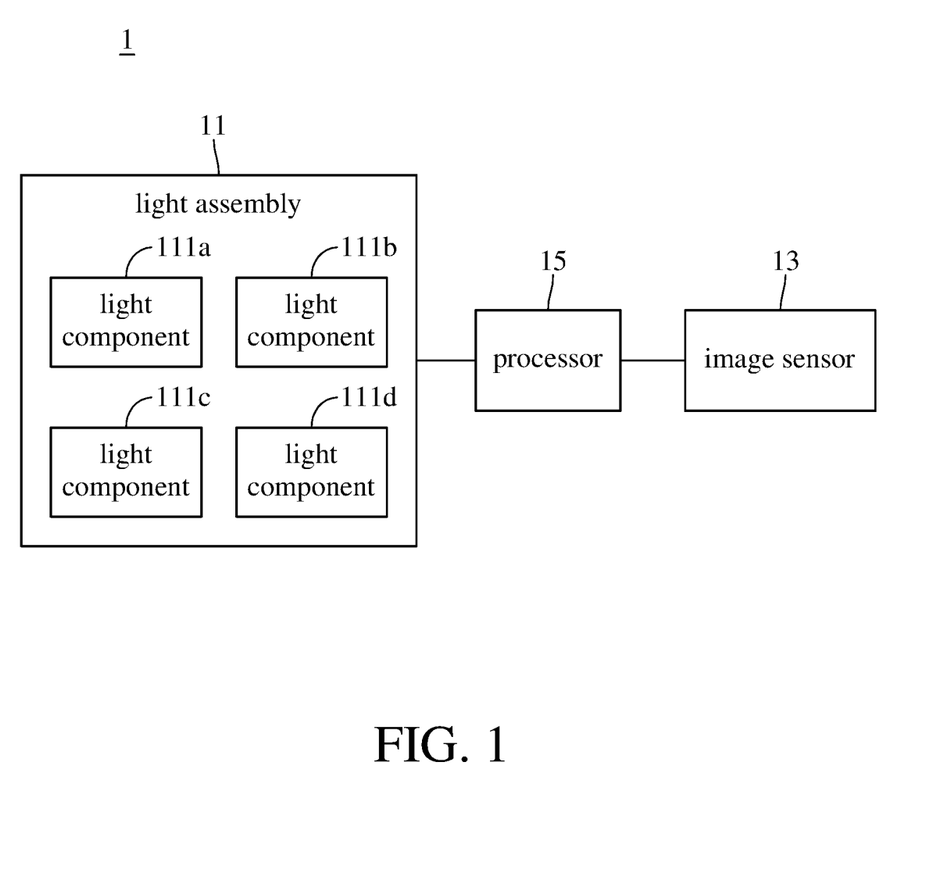
FIG. 1 is a function block diagram of a socket testing system according to an embodiment of this disclosure.

This disclosure provides a socket testing method and a socket testing system for testing a socket for fixing an electronic component, wherein said socket is, for example, a central processing unit (CPU) socket. Please refer to FIG. 1 that is a function block diagram of a socket testing system according to an embodiment of this disclosure. As shown in FIG. 1, the socket testing system 1 comprises a light assembly 11, an image sensor 13 and a processor 15, wherein the processor 15 is connected with the light assembly 11 and the image sensor 13.

The light assembly 11 is configured to illuminate a socket, such as the socket to be tested. The light assembly 11 can comprise a single light component or a number of light components. In an embodiment, the light assembly 11 comprises four light components 111a-111d that can respectively supply red light, green light, blue light and white light and can illuminate the socket at a plurality of angles respectively. For example, the above light components 111a-111d can be ring light components. It should be noted that FIG. 2 exemplarily illustrates that the light assembly 11 comprises four light components 111a-111d; however, the number of light components is not limited to this. In another embodiment, the light assembly 11 can comprise one or more of the light components 111a-111d, or more than four light components. The image sensor 13 is configured to capture a raw socket image of a socket. For example, the image sensor 13 can be an image sensor based on a charge coupled device (CCD), a complementary metal-oxide semiconductor (CMOS) or other sensing components.

In an embodiment, the socket testing system 1 can also comprise a control device for controlling the light assembly 11 and the image sensor 13. When the control device is triggered, the control device controls the light assembly 11 to illuminate the socket, and then controls the image sensor 13 to shoot the socket to obtain a raw socket image of the socket. The control device can comprise a user input device such as a button, a touch panel, etc.; thereby, the control device can be triggered by a user. In another embodiment, the light assembly 11 and the image sensor 13 can respectively comprise different control devices or be respectively controlled by different control devices, and these two control devices can be triggered by the user.

The processor 15 is configured to check whether the pinhead locations of the socket match the standard according to the raw socket image. In another embodiment, besides checking the pinhead locations of the socket, the processor 15 further checks whether the statuses of the pin bodies of the socket match the standard according to the raw socket image. When determining that any pinhead location or any pin body does not match the standard, the processor 15 generates the corresponding warning signal. More particularly, the processor 15 can comprise a memory storing the above standards of the pinhead locations and the pin body and other related instructions for implementing the check procedure, reference values, etc.; or, the processor 15 can comprise a wireless communication component that can have a communication connection with a remote database storing the data as described above so as to capture the data to perform the check procedure. The details of the check procedure and the standards will be described later.

The socket testing system 1 can further comprise an alarm device such as a warning light, a speaker, a display, etc. The processor 15 can transmit the warning signal to the alarm device to control the alarm device to output an alarm. The warning associated with the pinhead location can be the same as that associated with the pin body, or be different from that associated with the pin body, which is not limited in this disclosure. For example, the warning associated with the pinhead location can be red light, and the warning associated with the pin body can be yellow light; this disclosure does not be limited to this example.

Figure 2:
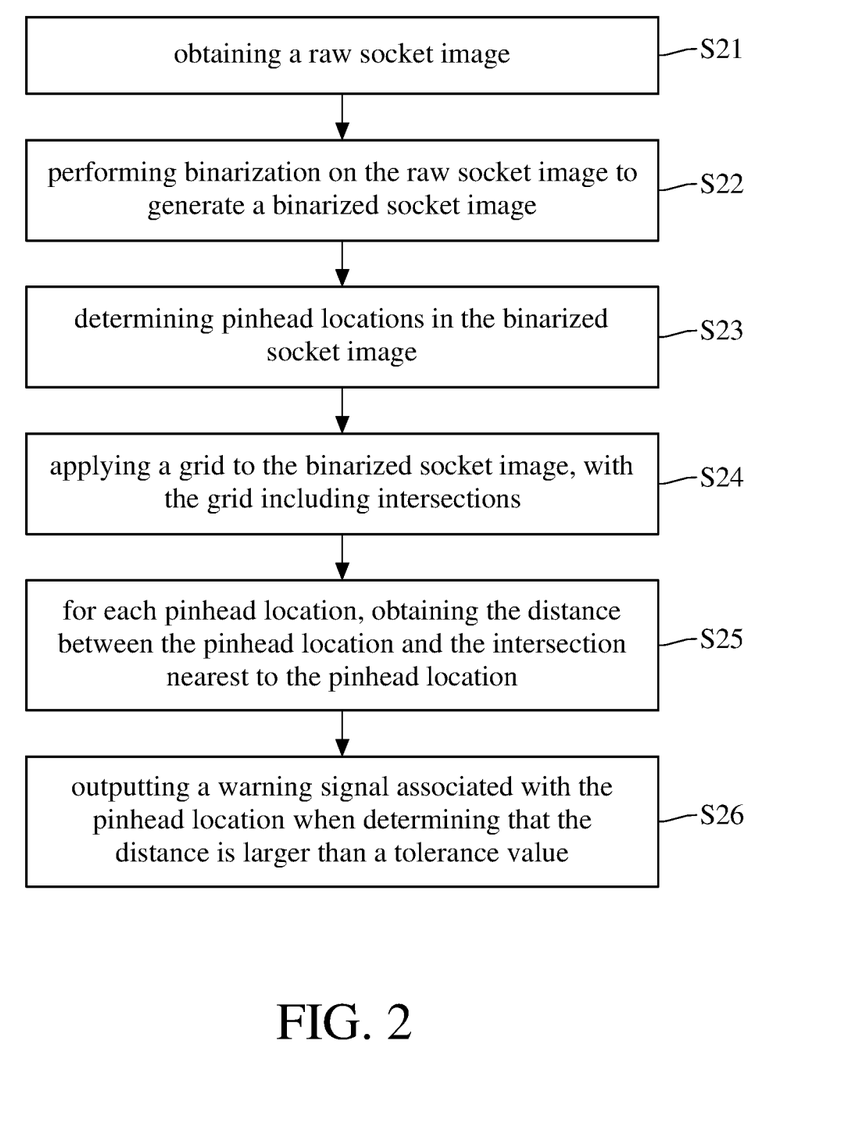
FIG. 2 is a flow chart of a socket testing method according to an embodiment of this disclosure.
Figure 3:
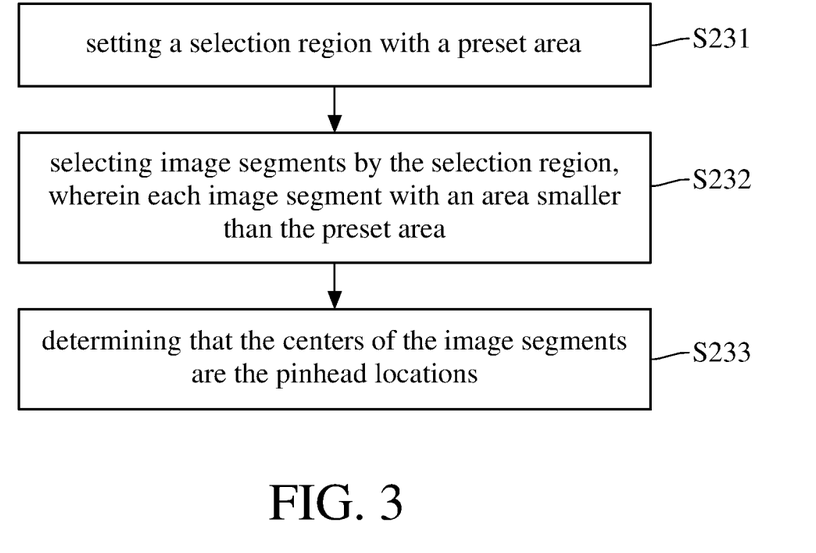
FIG. 3 is a schematic diagram of the execution of a socket testing method according to an embodiment of this disclosure.
Figure 4:
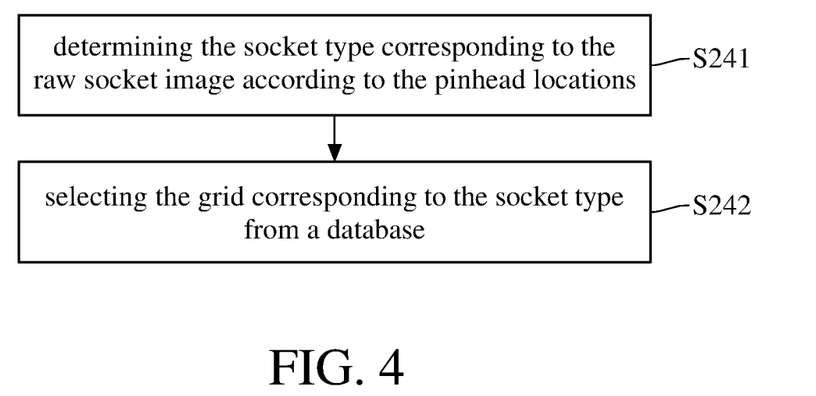
FIG. 4 is a flow chart of a step of determining pinhead locations in a socket testing method according to an embodiment of this disclosure.
Figure 5:
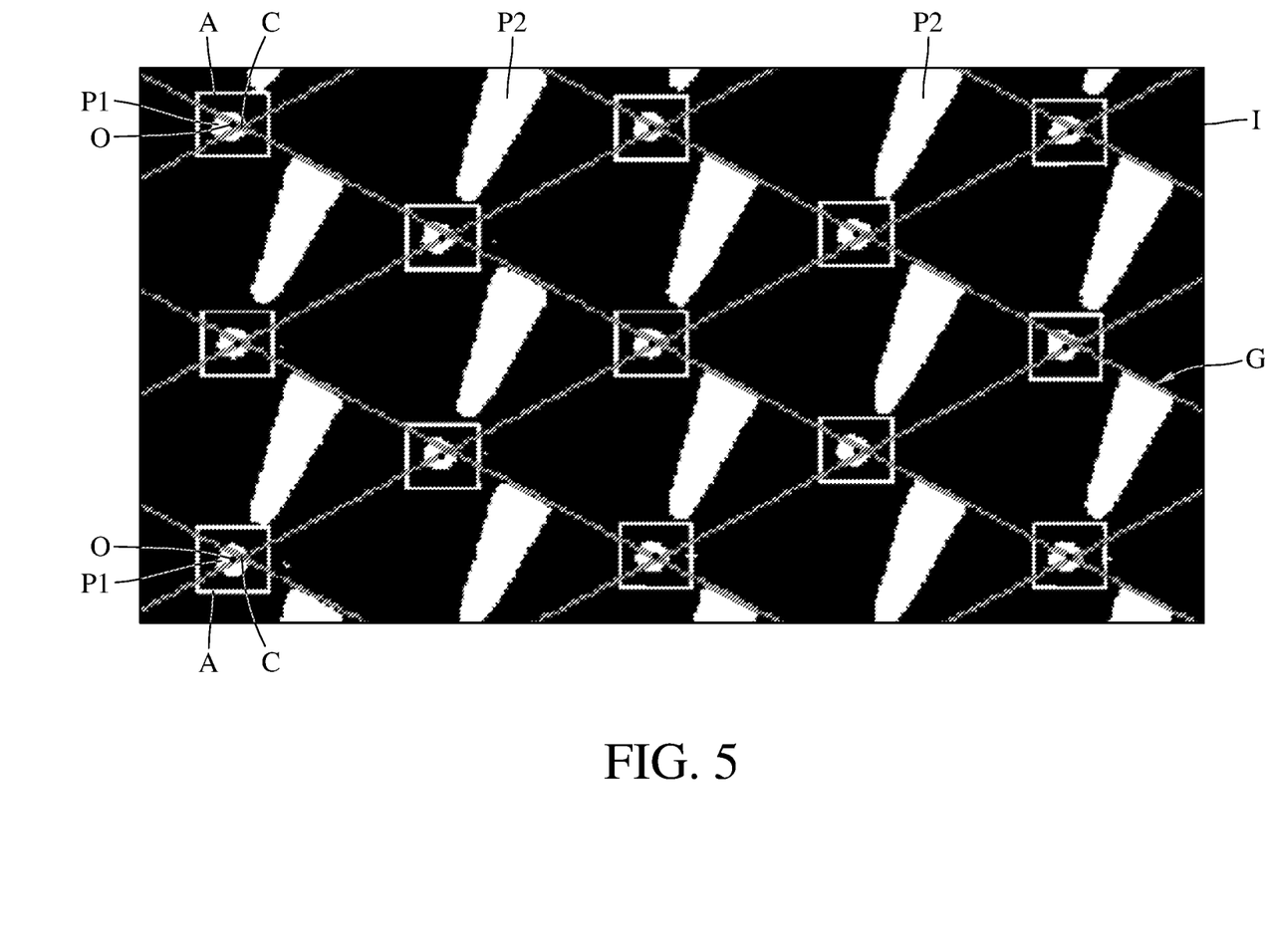
FIG. 5 is a flow chart of a step of applying a grid to a socket testing method according to an embodiment of this disclosure.

Please refer to FIGS. 1-5 for the description of the check procedure for pinhead locations, wherein FIG. 2 is a flow chart of a socket testing method according to an embodiment of this disclosure; FIG. 3 is a schematic diagram of the execution of a socket testing method according to an embodiment of this disclosure; FIG. 4 is a flow chart of a step of determining pinhead locations in a socket testing method according to an embodiment of this disclosure; and FIG. 5 is a flow chart of a step of applying a grid to a socket testing method according to an embodiment of this disclosure.

The processor 15 can execute the socket testing method as shown in FIG. 2. The socket testing method comprises step S21: obtaining a raw socket image; step S22: performing binarization on the raw socket image to generate a binarized socket image; step S23: determining pinhead locations in the binarized socket image; step S24: applying a grid to the binarized socket image, wherein the grid includes a plurality of intersections; step S25: for each pinhead location, obtaining the distance between the pinhead location and one of the intersections which is nearest to the pinhead location; and step S26: outputting a warning signal associated with the pinhead location when determining that the distance is larger than a tolerance value.

In step S21, the processor 15 can obtain the raw socket image of the socket from the image sensor 13. More particularly, the raw socket image is generated by shooting the image sensor 13 which is in the status of being illuminated by the light assembly 11, and the raw socket image can be a color photo. In step S22, the processor 15 performs binarization on the raw socket image to generate the binarized socket image. The details of the binarization are known to a person skilled in the art, and are not described herein.

In step S23, the processor 15 determines pinhead locations in the binarized socket image. More particularly, step S23 can include steps S231-S233 as shown in FIG. 3. In step S231, the processor 15 sets a selection region with a preset area. The preset area of the selection region is set to be between the area of the pinhead and the area of the pin body. In step S232, the processor 15 selects the image segments by the selection region, wherein the area of each image segment is smaller than the preset area of the selection region. Generally, the binarized socket image merely includes the image segments corresponding to the pinheads and the image segments corresponding to the pin bodies. Therefore, the image segments selected by the above selection region are the image segments corresponding to the pinheads. In step S233, the processor 15 determines that the centers of the selected image segments are the pinhead locations. More particularly, the selection region can be preset as a square. When selecting the image segments by the selection region, the processor 15 centers each image segment in the square, and considers the center of the square to be the center of the corresponding image segment, and determines the center is the pinhead location.

Please refer to FIG. 2. In step S24, the processor 15 applies a grid to the binarized socket image, wherein the grid includes intersections. More particularly, step S24 can include steps S241 and S242 as shown in FIG. 4. In step S241, the processor 15 determines the socket type corresponding to the raw socket image according to the pinhead locations determined in the step as aforementioned. For example, the processor 15 can determines the type of the socket to be tested according to the number, density, or other distribution status of the pinhead locations. In step S242, the processor 15 selects the grid corresponding to the determined socket type from a database to apply this grid to the binarized socket image. More particularly, the database can be the memory in the processor 15 or the remote database having the communication connection with the processor 15 as aforementioned. The database can store multiple grids respectively corresponding to different socket types. In another embodiment, the processor 15 can also generate a grid according to the pin locations. More specifically, the processor 15 can perform the following procedure to generate the grid: connecting the target pinhead location with one or more of the remaining standard pinhead locations which are nearest to the target pinhead location, determining main connection directions based on the connecting lines, and generating cross lines based on the connecting lines to form the grid. The processor 15 perform the above procedure on each pinhead location by regarding each pinhead location as the target pinhead location.

Please refer to FIG. 2. In step S25, for each pinhead location, the processor 15 obtains the distance between the pinhead location and the intersection nearest to the pinhead location. In step S26, when the processor 15 determines that any distance obtained in step S25 is larger than a tolerance value, the processor 15 generates and outputs a warning signal associated with the corresponding pin location. For example, the tolerance value can be set as 125 micrometers. More particularly, the pinhead locations of a normal socket are designed to be regularly spaced from each other, so based on the collinear principle, it can be determined that the pinhead location that is too far from the intersection of the grid (i.e. the collinear intersection) is abnormal.

In an embodiment, the processor 15 can control the alarm device to output a warning sound, to emit a warning light beam, or to display a warning message, etc. Moreover, the warning signal can contain information such as the calculated distance, the coordinate of the pinhead location, etc. The processor 15 can also record the warning signal in the internal memory or transmit the warning signal to a remote database.

Please refer to FIG. 5 for exemplarily explaining steps S23-S25 as aforementioned. As shown in FIG. 5, the binarized socket image I include image segments P1 corresponding to the pinheads and image segments P2 corresponding to the pin bodies. In step S23, the processor 15 can select the image segments P1 in the binarized socket image I by the selection regions A, consider the centers O of the selection regions A to be the centers of the image segments P1, and determine that the centers O are the pinhead locations. In step S24, the processor 15 applies the grid G having multiple intersections C to the binarized socket image I. In step S25, for each center O, the processor 15 calculates the distance between the center O serving as the pin location and the intersection C nearest to the center O, determines whether the calculated distance is larger than a tolerance value. In an embodiment, the processor 15 can be connected with a user interface such as a display or a touch screen and control the user interface to display the image as FIG. 5. In another embodiment, the display image transmitted to the user interface by the processor 15 can be the image of FIG. 5 wherein the binarized socket image I is replaced by the raw socket image. In this embodiment, the processor 15 can perform the check procedure for pinhead locations based on the binarized socket image I but show the schematic diagram of the implementation of the check procedure using the raw socket image on the user interface.

Figure 6:
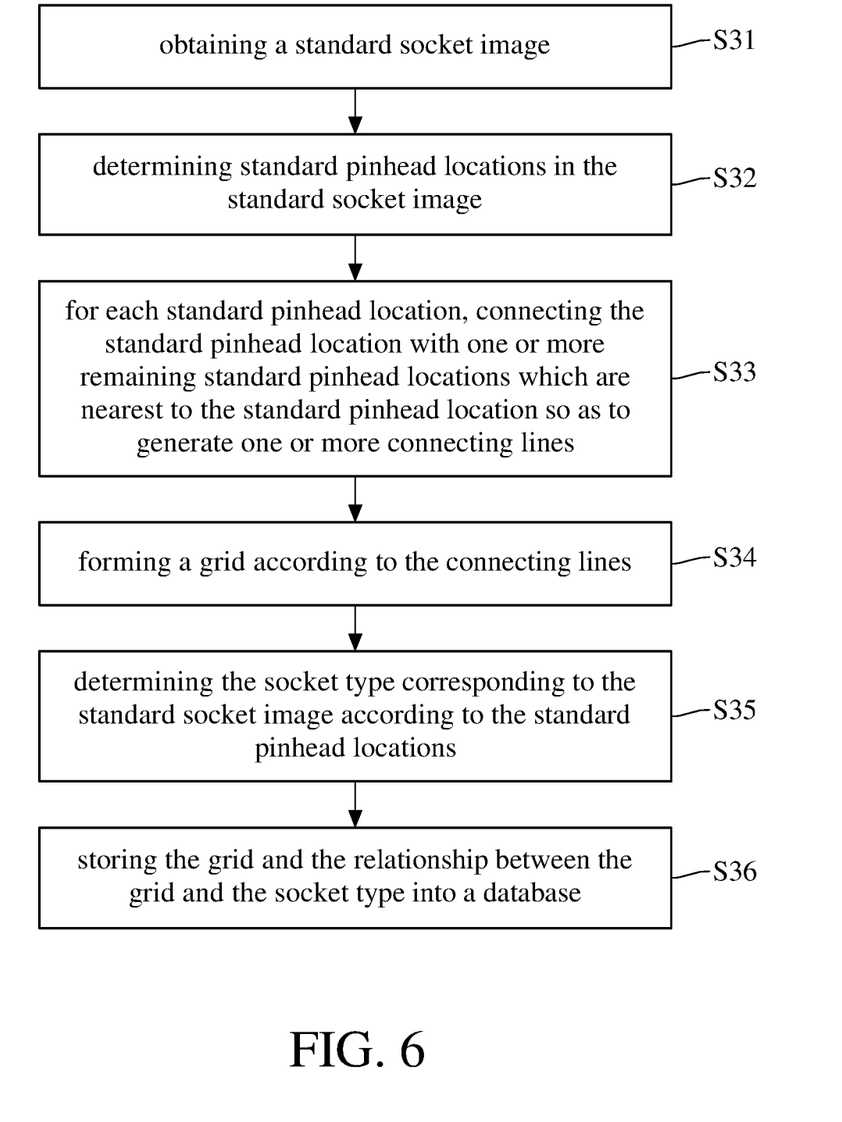
FIG. 6 is a flow chart of a generation procedure of a grid in a socket testing method according to an embodiment of this disclosure.

In an embodiment, a socket testing method comprises steps S21-S26 as aforementioned in the embodiment of FIG. 2, and further comprises a generation procedure of the grid before step S24. Please refer to FIG. 1 and FIG. 6, wherein FIG. 6 is a flow chart of a generation procedure of a grid in a socket testing method according to an embodiment of this disclosure, with the generation procedure comprising steps S31-S36. In step S31, the processor 15 obtains a standard socket image. More particularly, the standard socket image can be the design image of the socket to be tested, or the binarized image obtained by binarizing the image obtained by using the image sensor 13 to shoot a standard socket illuminated by the light assembly 11. In particular, the standard socket is a socket that is of the same kind as the socket to be tested but has been previously confirmed to have no defect.

In step S32, the processor 15 determines a plurality of standard pinhead locations in the standard socket image. The detailed determining method is similar to the determining method of step S23 in FIG. 2 as aforementioned, and is not described herein again. In step S33, for each standard pinhead location, the processor 15 connects the standard pinhead location with one or more remaining standard pinhead locations which are nearest to the standard pinhead location, so as to generate one or more connecting lines. In step S34, the processor 15 forms the grid according to the one or more connecting lines of each standard pinhead location. More particularly, the processor 15 can determine main connection directions based on the connecting lines, and generate cross lines based on the connecting lines to form the grid.

In step S35, the processor 15 determines the socket type corresponding to the standard socket image according to the standard pinhead locations. In step S26, the processor 15 stores the grid and the relationship between the grid and the socket type into the database. It should be noted that the above step S35 can be performed at any time after step S32 and before step S36. Moreover, the above steps S35 and S36 are optional. In an embodiment, after performing step S34 to generate the grid, the processor 15 can directly perform step S24 in FIG. 2 to apply the grid to the binarized socket image of the socket to be tested.

Figure 7:
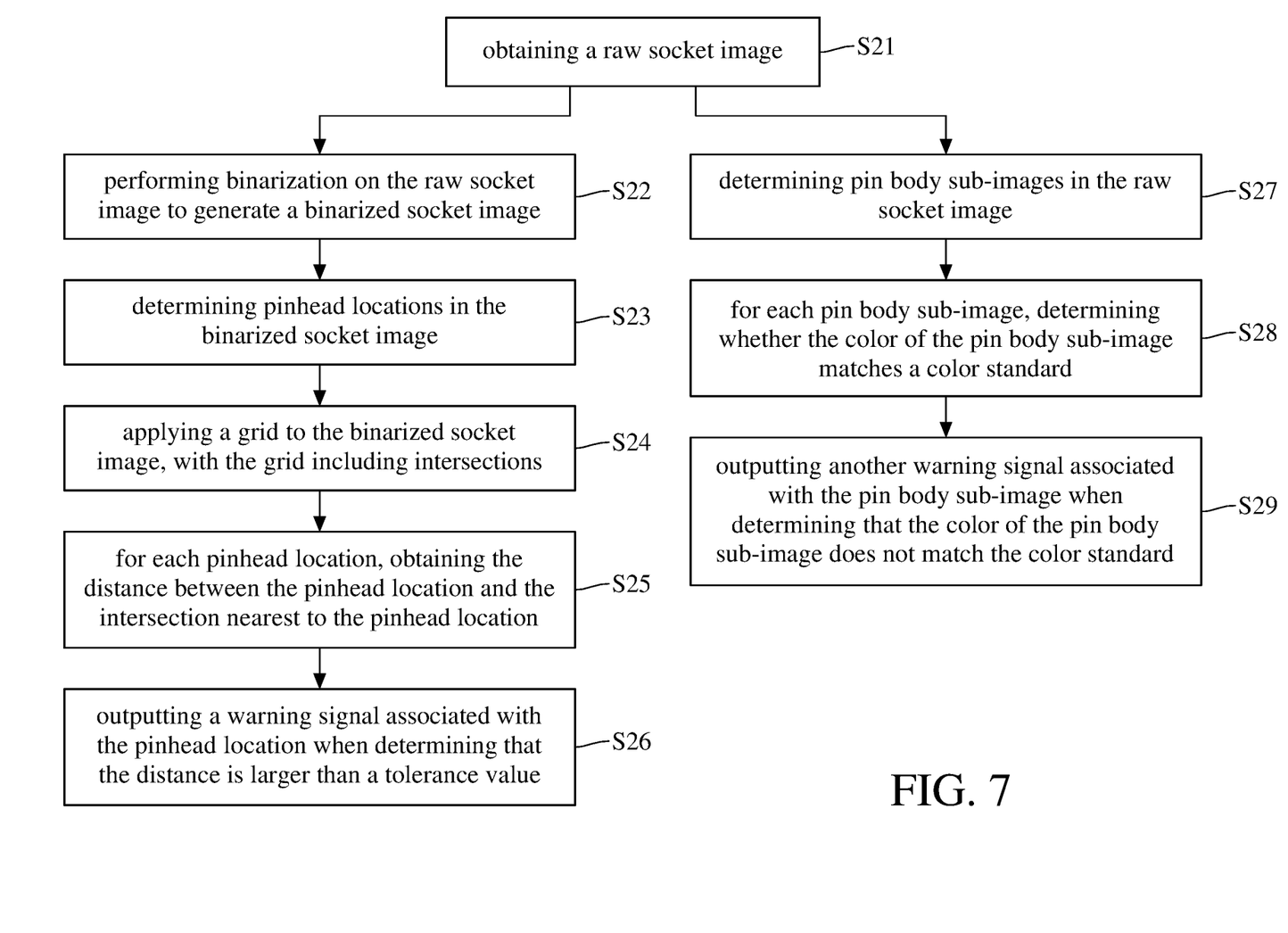
FIG. 7 is a flow chart of a socket testing method according to another embodiment of this disclosure.

As described before, the light assembly 11 of the socket testing system 1 can comprise the light components respectively supplying red light, green light, blue light and white lights and respectively illuminating the socket at multiple angles. In this embodiment, besides the check procedure for pinhead locations and the generation procedure of the grid as aforementioned, the socket testing system 1 can further perform a check procedure for pin bodies. Please refer to FIG. 1 and FIG. 7, wherein FIG. 7 is a flow chart of a socket testing method according to another embodiment of this disclosure. The socket testing method as shown in FIG. 7 comprises steps S21-S29. Step S21 is obtaining a raw socket image. In this embodiment, the raw socket image is a color image obtained by shooting a socket which is to be tested and illuminated by the light components respectively emitting red light, green light, blue light and white light. Steps S22-S26 in FIG. 7 belong to the check procedure for pinhead locations and their implementation is similar to that of steps S22-S26 as described before in the embodiment of FIG. 2, so it is not repeated here. Steps S27-S29 belong to the check procedure for pin bodies.

In step S27, the processor 15 of the socket testing system 1 determines a plurality of pin body sub-images in the raw socket image. The locations and shapes of the pin body sub-images correspond to those of the image segments P2 as shown in FIG. 5. For example, the processor 15 can obtain a specification (spec) document of the socket, and determines the distribution of the pin body sub-images according to the spec document. In step S28, for each body sub-image, the processor 15 determines whether the color of the pin body sub-image matches a color standard. More particularly, the color of the pin body sub-image is associated with the setting angle of the corresponding pin body. For example, the color standard can be red. The red pin body sub-image represents that the setting angle of the corresponding pin body is normal. In contrast, the blue pin body sub-image represents that the corresponding pin body is tilted or defective. In step S29, when the processor 15 determines that the color of any pin body sub-image does not match the color standard, the processor 15 generates a warning signal associated with that pin body sub-image. More particularly, the processor 15 can control the alarm device to output a warning sound, to emit a warning light beam, or to display a warning message, etc. Moreover, the warning signal can contain information such as the color of the pin body sub-images, the coordinate of the pin body sub-images, etc. The processor 15 can also record the warning signal in the internal memory or transmit the warning signal to a remote database.

In view of the above description, the socket testing method and system provided in this disclosure, based on the collinear principle of pinhead locations of a socket, determines whether any pinhead location of the socket is too far from the intersection of the applied grid, and accordingly determines whether the pinhead location is abnormal. Thereby, a testing method and system with high detection rate, low false rate and good stability may be provided. By the judgment based on the collinear principle, the calculation error resulted from the screw movement error of the system itself can be ignored. Moreover, with the setting and use of various light components, the socket testing method and system proposed in this disclosure can have both the check function of pinhead locations and the check function of pin bodies. By the establishment of the grid database, the socket testing method and system provided in this disclosure may be applied to various models of sockets, and have high adaptability.

What is claimed is:

1. A socket testing method, comprising:
   obtaining a raw socket image;
   performing binarization on the raw socket image to generate a binarized socket image;
   determining a plurality of pinhead locations in the binarized socket image;
   applying a grid to the binarized socket image, with the grid including a plurality of intersections;
   for each of the plurality of pinhead locations, obtaining a distance between the pinhead location and one of the plurality of intersections which is nearest to the pinhead location; and
   outputting a warning signal associated with the pinhead location when determining that the distance is larger than a tolerance value.

2. The socket testing method according to claim 1, further comprising:
   obtaining a standard socket image;
   determining a plurality of standard pinhead locations in the standard socket image;
   for each of the plurality of standard pinhead locations, connecting the standard pinhead location with one or more remaining standard pinhead locations which are nearest to the standard pinhead location so as to generate one or more connecting lines; and
   forming the grid according to the connecting lines.

3. The socket testing method according to claim 2, further comprising:
   determining a socket type corresponding to the standard socket image according to the plurality of standard pinhead locations; and
   storing the grid and a relationship between the grid and the socket type into a database.

4. The socket testing method according to claim 1, wherein applying the grid to the binarized socket image comprises:
   determining a socket type corresponding to the raw socket image according to the plurality of pinhead locations; and
   selecting the grid corresponding to the socket type from a database.

5. The socket testing method according to claim 1, wherein determining the plurality of pinhead locations in the binarized socket image comprises:
   setting a selection region with a preset area;
   selecting a plurality of image segments by the selection region, wherein each of the plurality of image segments with an area smaller than the preset area; and
   determining that centers of the plurality of image segments are the plurality of pinhead locations.

6. The socket testing method according to claim 1, wherein obtaining the raw socket image comprises illuminating the socket at a plurality of angles respectively by a plurality of light components, and capturing the raw socket image by an image sensor.

7. The socket testing method according to claim 6, further comprising:
   determining a plurality of pin body sub-images in the raw socket image;
   for each of the plurality of pin body sub-images, determining whether a color of the pin body sub-image matches a color standard; and
   outputting another warning signal associated with the pin body sub-image when determining that the color of the pin body sub-image does not match the color standard.

8. A socket testing system, comprising:
   a light assembly configured to illuminate a socket;
   an image sensor configured to obtain a raw socket image of the socket; and
   a processor connected with the light assembly and the image sensor, and configured to perform binarization on the raw socket image for generating a binarized socket image, to determine a plurality of pinhead locations in the binarized socket image, to apply a grid including a plurality of intersections to the binarized socket image, to obtain a distance between each of the plurality of pinhead locations and one of the plurality of intersections which is nearest to the pinhead location, and to output a warning signal associated with the pinhead location when determining the distance is larger than a tolerance value.

9. The socket testing system according to claim 8, wherein the light assembly comprises a plurality of light components configured to illuminate the socket at a plurality of angles respectively, and the processor is further configured to determine a plurality of pin body sub-images in the raw socket image, determining, for each of the plurality of pin body sub-images, whether a color of the pin body sub-image matches a color standard, and output another warning signal associated with the pin body sub-image when determining that the color of the pin body sub-image does not match the color standard.

* * * * *